United States Patent [19]
Stanasolovich et al.
[11] Patent Number: 5,023,201
[45] Date of Patent: Jun. 11, 1991

[54] SELECTIVE DEPOSITION OF TUNGSTEN ON $TiSi_2$

[75] Inventors: David Stanasolovich, Poughkeepsie, N.Y.; Leslie H. Allen, Champaigne, Ill.; James W. Mayer, Ithaca, N.Y.

[73] Assignee: Cornell Research Foundation, Inc., Ithaca, N.Y.

[21] Appl. No.: 575,460

[22] Filed: Aug. 30, 1990

[51] Int. Cl.[5] .......... H01L 21/44

[52] U.S. Cl. .......... 437/192; 437/200; 437/189; 437/228

[58] Field of Search .......... 437/192, 200

[56] References Cited

U.S. PATENT DOCUMENTS 4,940,509 7/1990 Tso et al. .......... 156/653
4,957,777 9/1990 Ilderem et al. .......... 437/200

OTHER PUBLICATIONS

R. Beyers et al., "Titanium Disilicide Formation on Heavily Doped Si Substrates," *J. Appl. Physics*, vol. 61, No. 11, Jun. 1, 1987, pp. 5110–5117.

E. K. Broadbent, A. E. Morgan, J. M. Deblasi, P. van der Putte, B. Coulman, B. J. Burrow, D. K. Sadana, and A. Reader, J. Electrochem. Soc. 133, 1715 (1986).

C. Yang, S. Mehta, and P. Davies, Mater. Res. Soc. Symp. Proc. 76, 247 (1987).

S. S. Chen, S. Sivaram, and R. K. Shukla, J. Vac. Sci. Technol., B5, 1730 (1987).

H. H. Busta and C. H. Tang, J. Electrochem. Soc. 133, 1195 (1986).

M. Wong, N. Kobayashi, R. Browning, D. Paine and K. C. Saraswat, J. Electrochem. Soc., 134, 2339–2345 (1987).

M. L. Green, Y. S. Ail, T. Boone, B. A. Davidson, L. C. Feldman and S. Nakhara, J. Electrochem. Soc., 134, 2285 (1987).

R. C. Ellwanger, J. E. J. Schmitz, R. A. M. Wolters, and A. J. M. van Dijk in "Proceedings of the 1986 Workshop on Tungsten and Other Refractory Metals for VLSI Applications II" MRS, Pittsburgh, Pa., pp. 399–407 (1986).

C. M. McConica and K. Krishnamani, J. Electrochem. Soc., 133, 2542–2548 (1986).

C. M. McConica and K. Krishnamani, 1984 Workshop, Materials Research Society, pp. 433–442 (1985).

Y. Pauleau, F. C. Dassapa, P. H. Lami, J. C. Oberlin and F. Romagna, J. Mater. Res., 4, 156 (1989).

R. Beyers and R. Sinclair, J. Appl. Phys., 57, 5240–5245 (1985).

H. J. W. van Houtum and I. J. M. Raaijamakers, Mater. Res. Soc. Symp. Proc., 54, 37 (1986).

H. J. W. van Houtum and I. J. M. Raaijmakers, J. Appl. Phys., 61, 3116–3118 (1987).

I. J. Raaijmakers, A. H. van Ommen and A. H. Reader, J. Appl. Phys. 65, 3896–3906 (1989).

F. M. d'Heurle, A. Cros, R. D. Frampton and E. A. Irene, Philos. Mag. B, 55, 291–308 (1987).

*Primary Examiner*—Brian E. Hearn
*Assistant Examiner*—Laura M. Holtzman
*Attorney, Agent, or Firm*—Jones, Tullar & Cooper

[57] ABSTRACT

An improved process for preparing selective deposition of conductive metals on disilicide encroachment barriers allows the construction of integrated circuit components wherein the metal/disilicide interface is substantially free of O and/or F contamination. The level of interfacial oxygen and/or fluorine contamination in the selective W deposition on the $TiSi_2$ was substantially reduced or eliminated by first forming a C49 $TiSi_2$ phase on a substrate, selectively depositing W on the C49 $TiSi_2$ phase and thereafter annealing at a (minimum) temperature sufficient to convert the high resistivity phase C49 $TiSi_2$ to the low resistivity phase C54 $TiSi_2$.

16 Claims, 5 Drawing Sheets

INSITU SPUTTER CLEAN Si SUBSTRATE
↓
TITANIUM SPUTTER DEPOSITION
↓
FORM C49 TISI2 (WITH RTA ANNEAL-675 C / 15 s)
↓
REMOVE UNREACTED Ti/TiN
↓
PRE-TUNGSTEN DEPOSITION CLEAN (200:1HF)
↓
SELECTIVE TUNGSTEN DEPOSITION
↓
FORM C54 TiSi2 RTA ANNEAL (700C - 800C) / 15S

ATOMIC COMPOSITION (%)
SPUTTER TIME (min.)
W
Ti
Si
O
F
0
10
20
30
40
50
60
70
80
90
100

ATOMIC COMPOSITION (%)
SPUTTER TIME (min.)
W
Si
Ti
F
O
0
10
20
30
40
50
60
70
80
90
100

ATOMIC COMPOSITION (%)
100
90
80
70
60
50
40
30
20
10
0
W
Si
Ti
O
F
0
10
20
30
40
50
60
SPUTTER TIME (min.)

SELECTIVE DEPOSITION OF TUNGSTEN ON $TISI_2$

The present invention relates to fabricated semiconductor devices and more specifically to a process for the selective deposition of tungsten (W) and/or other refractory metals on titanium disilicide ($TiSi_2$) wherein the W-$TiSi_2$ interface is substantially free of contamination by oxygen and/or fluorine.

BACKGROUND OF THE INVENTION

Selective W deposition on $TiSi_2$ has been found to cause several unique problems as noted by Broadbent et al, *J. Electrochem. Soc.* 133:1715–1721 (1986). These problems include oxygen (O) contamination at the W-$TiSi_2$ interface, residual $TiF_3$ at the W-$TiSi_2$ interface, and the depletion of Si from the $TiSi_2$ surface during the selective W deposition. The most prevalent of these problems is the large level of interfacial O contamination and as a result, O contamination has been widely discussed in the literature.

Several authors have shown that the native oxide ($TiO_2$ or $SiO_2$) present on the substrate ($TiSi_2$ or Si) prior to the selective W deposition is a source of the O contamination observed at the W-$TiSi_2$ or W-Si interface. Wong, et al, *J. Electrochem. Soc.* 134: 2339–2345 (1987), showed that the presence of a native oxide on the Si substrate prior to the selective W deposition results in a significantly larger interfacial O concentration than does the case without a native oxide. Busta and Tang, *J. Electrochem. Soc.* 133:1195–1200 (1986), showed that the native oxide thickness on Si prior to the selective W deposition correlated with the interfacial O concentration, but could not account for the large O signal observed. They found that a native oxide thickness greater than approximately 4 nm prevented W deposition entirely. Chen et al, *J. Vac. Sci. Technol.;* B5, 1730–1735 (1987), observed a large O and F concentration and poor W adhesion if the surface oxide ($TiO_2$) was not removed by a HF based clean prior to the selective W deposition.

Titanium disilicide, a useful contact barrier, is commonly employed as the cladding layer in the source, drain and gate electrode regions Because of the wide need for metalization of semiconductor devices and for the selective deposition of tungsten and other elements on encroachment barriers such as titanium disilicide, it is important to develop Very Large Scale Integration (VLSI) processes which result in interfaces that are free of contamination.

BRIEF DESCRIPTION OF THE INVENTION

One aspect of the invention relates to the selective deposition of refractory metals such as tungsten on encroachment barriers including titanium disilicide ($TiSi_2$) and to semiconductor and integrated current devices fabricated therefrom Another aspect of the invention relates to the selective deposition of tungsten on titanium disilicide to provide a system having a titanium disilicate barrier layer on a substrate where the tungsten - $TiSi_2$ interface is substantially free of contamination such as oxygen and fluorine A further aspect of the invention relates to an improved process for the selective tungsten deposition on the silicide barrier where the silicide is C49 $TiSi_2$.

A further aspect of the invention relates to a product prepared according to the improved process where tungsten is selectively deposited in C49 $TiSi_2$ and the resulting object is subsequently annealed at a time and temperature sufficient to convert the C49 silicide phase to a C54 silicide having a resistivity suitable for integrated circuit and associated interconnections.

A yet further aspect of the present invention comprises semiconductor devices and integrated circuits using the improved selective tungsten deposition on barrier disilicide.

DETAILED DESCRIPTION OF THE INVENTION

The present invention relates to the selective deposition of refractory metals on silicide encroachment barriers on a substrate including silicon where the barrier material prevents substrate consumption and encroachment of the selectively deposited metal into the substrate. Such systems and processes are useful in fabricating integrated circuits and low sheet resistance interconnects at the silicon level.

The term "selective deposition" used herein relates to the deposition on particular materials of a substrate to the exclusion of dissimilar materials on that substrate such as for example the deposition on metal and semiconductor surfaces to the exclusion of deposition on insulator surfaces of a substrate. Deposition can be effected on both metals and semiconductor material. Selective W deposition is defined as the deposition of W on Si or Si containing material without deposition on insulating surfaces.

In the present invention relating in one mode to the selective deposition of tungsten on titanium disilicide, it was found that interfacial oxygen (O) and fluorine (F) contamination could be minimized or eliminated by the deposition of W on the metastable C49 phase titanium disilicide rather than the C54 titanium disilicide.

Figure 1:
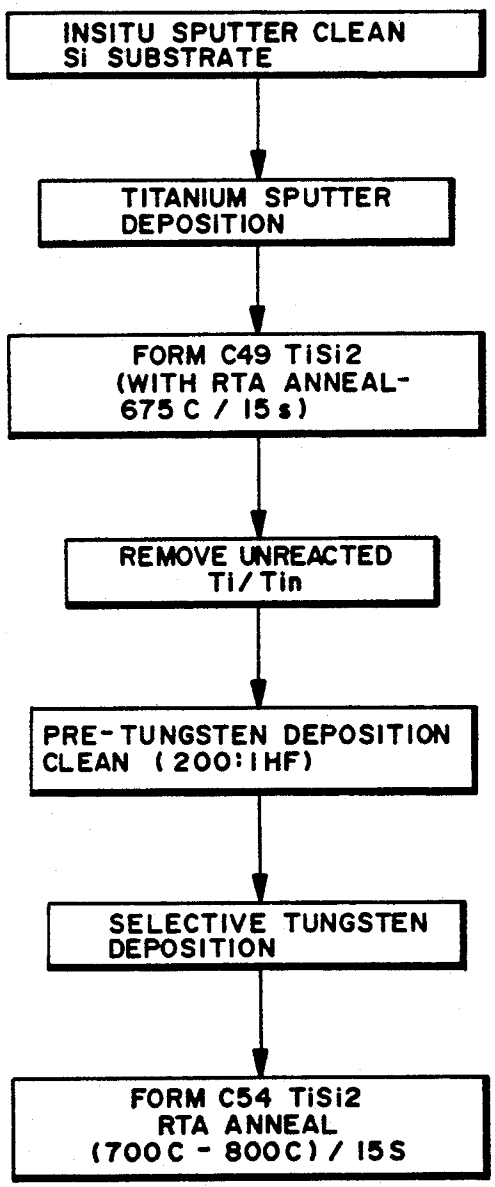
FIG. 1 is a process flow chart showing process steps in the improved process for selective deposition of tungsten on C49 $TiSi_2$.
Figure 2:
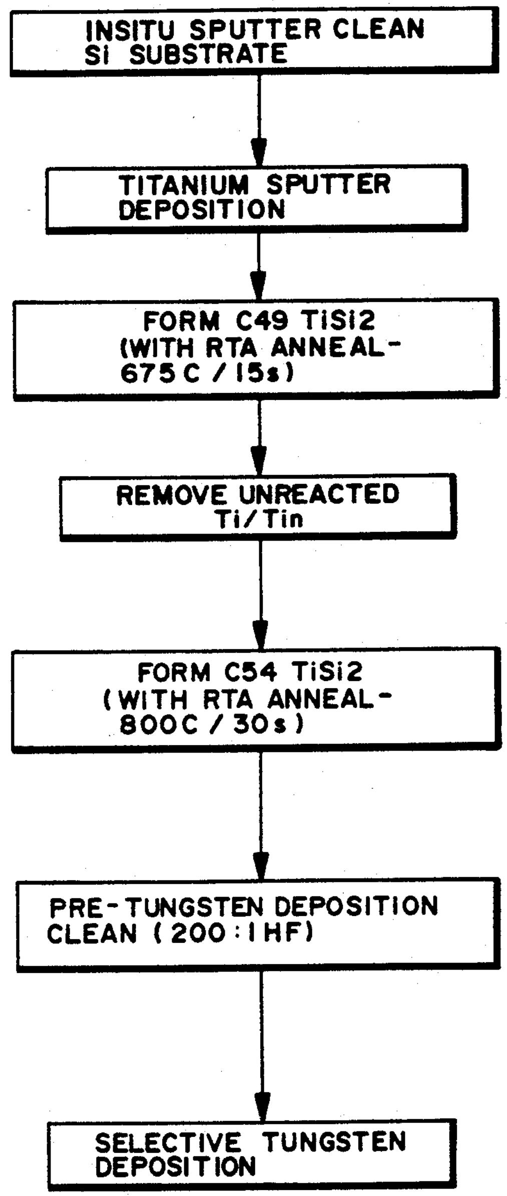
FIG. 2 is a process flow chart showing the Conventional Process for Selective Tungsten deposition on C54 $TiSi_2$.

The process flow diagram for the present invention, shown in FIG. 1 distinguishes the improved process using deposition on the metastable C49 $TiSi_2$ over the conventional prior art process shown in FIG. 2. In the improved process, the tungsten is deposited on C49 $TiSi_2$ and the product is subsequently annealed to convert the C49 $TiSi_2$ phase to C54 $TiSi_2$.

More specifically, the invention relates to an improved process for the selective deposition of tungsten on a titanium disilicide surface, preferably on a substrate such as silicon or silicon dioxide, which comprises:

1) first forming a $TiSi_2$ layer on a substrate wherein said titanium disilicide is characterized as a metastable C49 titanium disilicide ($TiSi_2$);
2) selectively depositing tungsten (W) on said metastable C49 $TiSi_2$ layer to give a product wherein the W/C49 $TiSi_2$ interface is substantially free of oxygen and/or fluorine contamination; and
3) annealing the product of step 2 at a temperature sufficient to convert the C49 $TiSi_2$ to C54 $TiSi_2$; wherein the C49 $TiSi_2$ layer of step 2 is characterized by a resistivity of from about 90 μohm-cm to about 100 μohm-cm and is converted by annealing to C54 $TiSi_2$ having a resistivity in the range of from about 15 μohm-cm to about 20 μohm-cm.

The invention further relates to an article prepared according to the above process and to semiconductor and microelectronic devices containing said improved structure, said article comprising a substrate, a disilicide encroachment barrier on said substrate and a refractory metal layer, preferably tungsten, selectively deposited on the disilicide barrier wherein the interface between the metal-disilicide barrier is substantially free of oxygen and/or fluorine contamination.

Although Beyers et al, *J. Appl. Phys.* 57:5240–5245 (1985) and others have studied the formation of a metastable phase $TiSi_2$ and its conversion to the low resistivity equilibrium phase C54 $TiSi_2$. To date, selective W deposition on the C49 phase of $TiSi_2$ has not been investigated.

Figure 3:
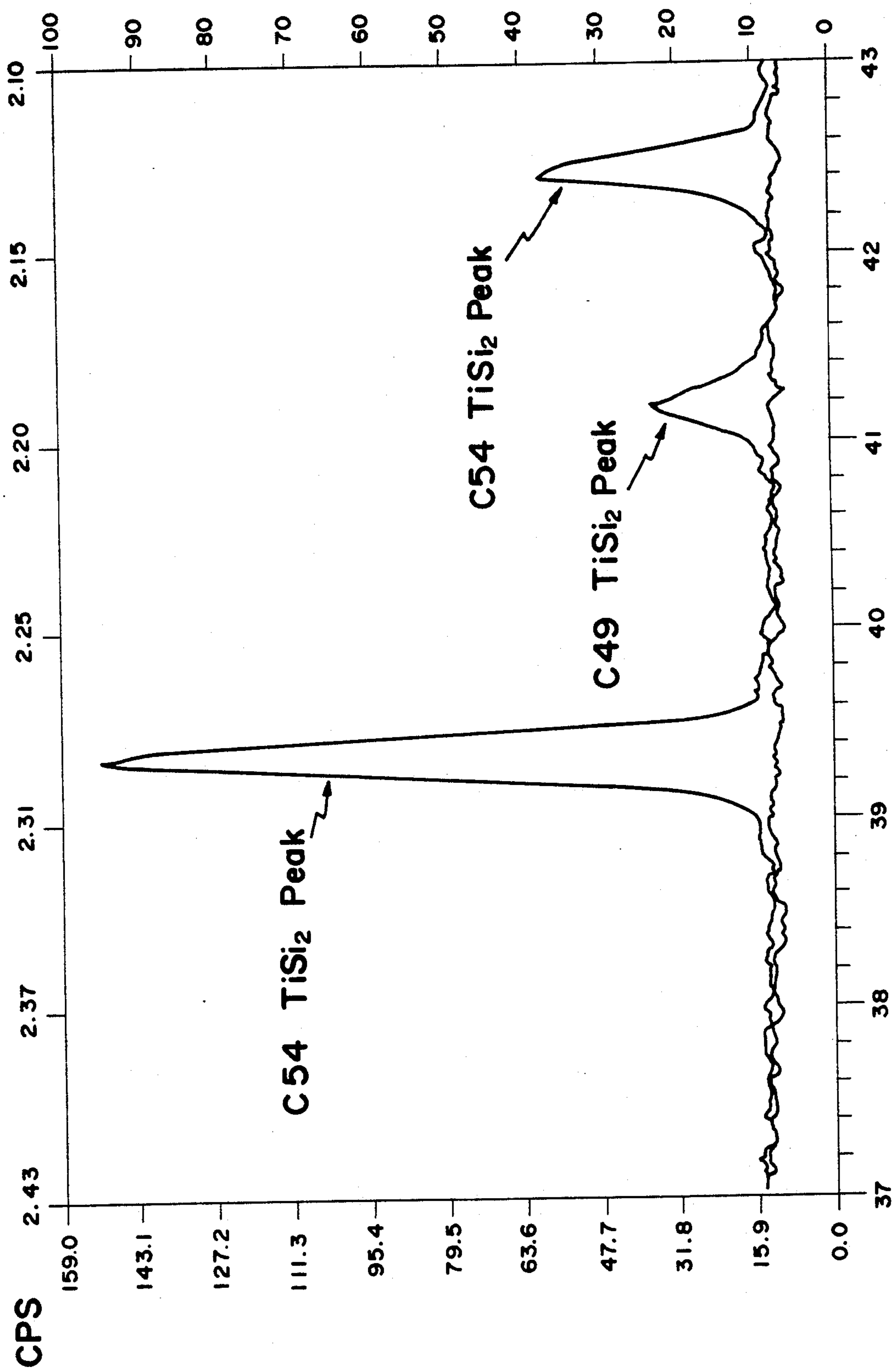
FIG. 3 is a graph showing x-ray diffraction results identifying the C49 and C54 $TiSi_2$ phases.

There are several key physical differences between the two $TiSi_2$ phases. X-ray diffraction patterns for the C49 and C54 $TiSi_2$ phases are shown in FIG. 3. Raaijmakers et al, *J. Appl. Phys.* 65:3896–3906 (1989) showed that the C49 phase contains a significant amount of excess Si which is precipitated out on the $TiSi_2$ surface during the transformation to the C54 phase. As a result, the surface of C54 $TiSi_2$ phase is Si rich. They also observed that by increasing the anneal time during the formation of the C49 phase an increasing amount of excess Si precipitates out onto the $TiSi_2$ surface. The second major difference between these two phases is that the C49 phase has a very high stacking fault density. Such stacking faults are removed during the transformation (anneal) to the C54 phase. The third major difference between these two $TiSi_2$ phases is the grain size. The grain size of C49 $TiSi_2$ was found to be about 1.2 μm, while the grain size of the C54 phase was found to be 3.0 μm.

In one mode of the present invention, tungsten is deposited on the C49 $TiSi_2$ rather than on the C54 $TiSi_2$ phase and by moderation of the temperature, the thermal budget of the process is considerably reduced. This can be accomplished by the process sequence shown in FIG. 1 for the selective deposition of W on C49 $TiSi_2$. Following the Ti deposition on the silicon substrate, the C49 phase of $TiSi_2$ is formed with a 675° C. anneal for 15 seconds in $N_2$. The TiN formed during the anneal and the unreacted Ti are selectively removed by 5:1 $H_2So_4$:$H_2O_2$ solution. After the deposition and patterning of the passivation oxide, selective W deposition can be performed on the high resistivity metastable C49 $TiSi_2$ phase. The metastable $TiSi_2$ can be transformed to the low resistivity C54 phase and the passivation oxide can be densified by a single (700° to 750° C.) anneal following the selective W deposition. As a result, the thermal budget for the shallow junctions and $TiSi_2$ can be reduced.

The metal elements useful in selective deposition broadly include platinum, molybdenum, titanium, titanium nitride, tungsten, tantalum, tantalum nitride, copper, silver, aluminum and the like. The refractory metals are preferred and tungsten deposition is most preferred especially when selectively deposited on titanium disilicide ($TiSi_2$). Selective deposition can be effected via means known to the art including the reaction of metal fluorides with hydrogen or with silicon containing hydrides such as silane ($SiH_4$). In the formation of titanium disilicide deposition may be effected by the reduction of tungsten hexafluoride with hydrogen, silicon hydrides, silicon and the like.

While selective deposition on titanium disilicide is preferred, the refractory metal may be deposited on other silicides such as for example: Tungsten disilicide ($WSi_2$), platinum silicide (ptsi), molybdenum disilicide ($MoSi_2$), tantalum disilicide ($TaSi_2$), vanadium disilicide ($VSi_2$), nickel silicide ($NiSi_2$ or $Ni_2Si$), chromium disilicide ($CrSi_2$), niobium disilicide ($NbSi_2$) and the like. These silicides are often structurally similar and display similar metallurgical properties.

The $TiSi_2$ and other silicides are usually formed on the surface of a substrate such as silicon, polycrytalline silicon, $SiO_2$, $Si_3N_4$ and the like by various methods known in the art which include for example: chemical vapor deposition (CVD), sputtering, and evaporation. The various silicides can be made silicon-rich by implantation and equivalent processes.

Various methods and apparatus are known for applying uniform coatings to integrated circuit wafers including chemical vapor deposition. Refractory metals such as tungsten, molybdenum and tantalum are useful for small circuit interconnect lines because of their ability to carry large current densities without electromigration and because of melting points higher than aluminum which allow high temperature processing subsequent to the metalization steps. Tungsten is particularly advantageous because of its thermal coefficient of expansion which is close to that of silicon and because of its known corrosion resistance. Although other methods of deposition can be practiced, chemical vapor depositions (CVD) methods and low pressure chemical vapor deposition (LPCVD) are preferred because of the rapidity of deposition, the required temperature and the resistivity of the deposit.

Typically, when tungsten is the selective deposit metal, it can be deposited at a rate in the order of about 7 to 10 Angstroms/minute to provide film thickness up to about 10,000 Angstroms. Advantageously, the tungsten deposits selectively on the silicide and not on the base substrate.

When tungsten or other refractory metal is to be selectively deposited on the various silicides enumerated above, the formation of the disilicide on a substrate should be effected by methods known in the art to form a silicon-rich silicide layer. The term "silicon-rich" is thus meant to convey that the reactants or conditions were such that the formed silicide layer or at least the surface thereof contains an amount of silicon slightly greater than is required by stoichiometric formula for the disilicide. When silicon-rich silicides are prepared, it is preferred to use from about 2.5 to about 5.0 atomic percent silicon in excess of the stoichiometric amount. Silicon-rich silicides having at least 3.0 percent excess silicon are most preferred. If too much silicon is used excess silicon will precipitate near the surface upon annealing and this will be disadvantageous for the intended properties of the product and its use in microelectronic devices.

In addition to O and F, oxygen and fluorine contamination also includes bound oxygen and various forms of fluorine such as, for example $TiF_3$.

P-type silicon, 0.5–5.0 ohm-cm, (100) orientation wafers were prepared for titanium (Ti) deposition by removing the native oxide with a solution of 50:1 (deionized water:HF) dilute HF for 60 seconds followed by rinsing in deionized water and drying. The wafers were loaded in a sputtering system which was subsequently evacuated to a base pressure less than 5.0 $E^{-7}$ torr. Any remaining native oxide was removed by an in situ DC sputter clean (200 volts, 30.0 mA) in an argon (Ar) atmosphere for 3.0 minutes prior to the Ti deposition. Ti was sputter deposited in an Ar atmosphere to a target thickness of 50 nm.

The C54 $TiSi_2$ (8–10) samples were fabricated by a two step process in an Ar ambient in an rapid thermal annealing system at temperature of 675° C., and 800° C. for 15 seconds and 30 seconds, respectively. The C49 $TiSi_2$ samples were fabricated by a single anneal at 675° C. in an Ar atmosphere for 15 seconds. The temperature was determined using a thermocouple mounted on a silicon chip situated adjacent to the experimental sample. Unreacted Ti was removed with a solution of 5:1 $H_2SO_4$:$H_2O_2$ for 10 minutes followed by rinsing in deionized water and drying. This sequence was repeated with a fresh solution to ensure complete removal of the unreacted Ti. Within one hour before the selective W deposition, the samples were exposed to a 200:1 dilute HF solution for 20 seconds followed by rinsing and drying. This step is designed to remove any native oxide on the $TiSi_2$ surface. Selective W was deposited in a Genus cold wall low pressure Chemical Vapor Deposition (LPCVD) system using $WF_6$ and $H_2$ in a 1:20 ratio as the feed gases.

Sheet resistance was measured after every major operation. AES depth profiles and Rutherford Backscattering Spectroscopy (RBS) were performed at key points before and after the selective W deposition. X-Ray Diffraction (XRD) was used to identify the C49 and C54 $TiSi_2$ phases as shown in FIG. 3.

The following Examples which generally exemplify the present invention should not be construed as limiting the invention either to the particular selective deposition of a refractory metal or to a particular encroachment barrier.

EXAMPLE 1

The Process Flow Diagram Chart for the process of the present invention is shown in FIG. 1 and can be compared with the prior art method shown in FIG. 2. The following process steps for the present invention were carried out on the silicon wafers described above following the definition of the N+; P+ source, drain and gate electrode regions by implantation and activation.

1) Wafers were loaded into a sputtering system which was subsequently evacuated to a base pressure less than 5.0E–7 torr.
2) Native oxide was removed by an in situ DC sputter clean (200 volts, 30.0mA) in an argon (Ar) atmosphere for 1.0–3.0 minutes prior to the Ti deposition.
3) Ti was sputter deposited in an Ar atmosphere to a target thickness of 20nm to 50nm depending on the process technology.
4) The C49 phase of $TiSi_2$ was formed using a rapid thermal anneal (RTA) in an $N_2$ atmosphere at 575° C. to 675° C. for 10–20 seconds.
5) Unreacted Ti and TiN were selectively removed with respect to the C49 $TiSi_2$ film using 5:1 solution of $H_2SO_4$:$H_2O_2$.
6) The passivation oxide was deposited using chemical vapor deposition (CVD). The passivation oxide may contain deports such as Boron (B), Phosphorous (P) and/or Arsenic (As). The preferred object was a passivation oxide that is deposited using CVD and contains 1.0–2.0 mole percent Phosphorus (for mobile ion gettering). The passivation oxide is not densified by thermal means.
7) The passivation oxide was planarized by a mechanical/polishing process.
8) Contact windows were formed by a standard photolithography and etching processes. The preferred etching process was a reactive Ion Etch (RIE) process in a hexode reactor using the following process conditions.

$CHF_3$—10% $O_2$

Pressure—50 m torr

DC Bias Voltage—550 volts

The etch process used an etch rate ratio of passivation oxide to C49 $TiSi_2 > 12:1$.
9) The photoresist mask was removed using an $O_2$ plasma strip. The wafers are cleaned in a solution of 3:1 $H_2SO_4$:$H_2O_2$. Following this, the wafers were rinsed in deionized wafer and dried.
10) A pre-deposition clean was performed to remove the native oxide on the C49 film. A dilute HF solution on an in situ sputter clean may be used for this clean. The clean removes at most, 5.0 nm of C49 $TiSi_2$.
11) Immediately following the pre-deposition clean, selective W was deposited on the C49 phase of $TiSi_2$ using a CVD process. A cold walled reaction with a 20:1 $H_2$:$WF_6$ feed mixture and a deposition temperature of 575° C. was used for the W deposition. Any equivalent selective W deposition reaction and temperature can be substituted. Additionally, alternate $WF_6$ based feed gas compositions may be employed.
12) The C49 phase of $TiSi_2$ was transformed to the low resistivity C54 phase of $TiSi_2$ by a 700° C. anneal in an $N_2$ atmosphere for 15–30 seconds. This anneal also densified the passivation oxide.

Figure 5:
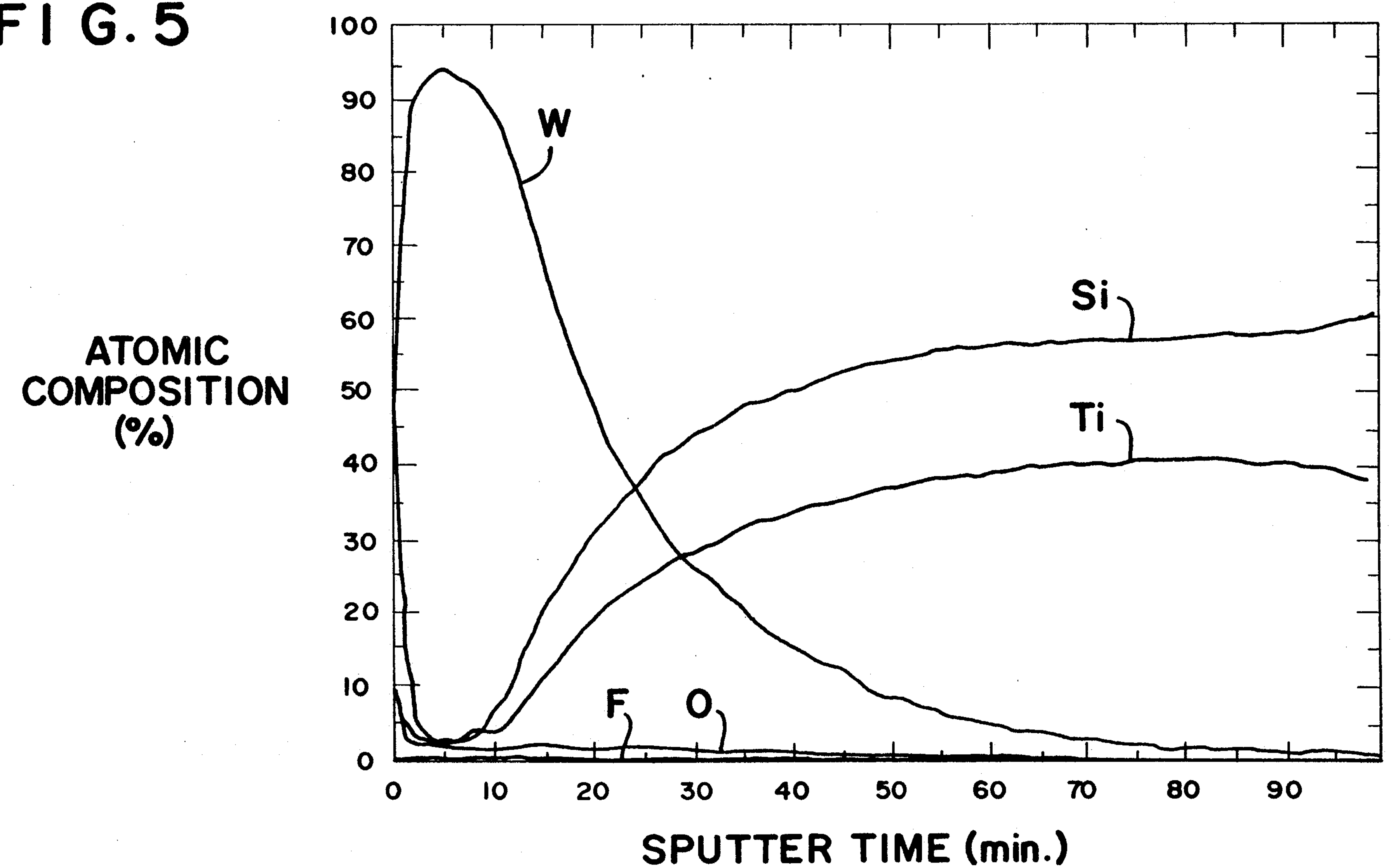
FIG. 5 is a plot of AES depth profile of selective W deposition on C49 $TiSi_2$.

The AES depth profile of selective tungsten deposition on C49 $TiSi_2$ is shown in FIG. 5 plot of atomic composition versus sputter time in minutes. From FIG. 5 it is seen that the interfacial O concentration has been reduced to a negligible level. This is quite surprising because all previous experimental trials on C54 $TiSi_2$ without the $H_2$ pre-deposition purge contained a large level of oxygen contamination at the W-$TiSi_2$ interface. Further, the interfacial F concentration has been reduced to a negligible level without the use of a damage inducing implant A third observation is that the $TiSi_2$ surface, after the selective W deposition, is Si rich. In contrast, all of the C54 $TiSi_2$ samples are very Ti rich at the surface after the selective W deposition.

EXAMPLE 2

Selective W Deposition on C54 $TiSi_2$ (Conventional Method)

The following process steps as illustrated in FIG. 2 for the conventional deposition on C54 $TiSi_2$ were carried out following the definition of the N+, P+ source, drain and gate electrode regions by implantation and activation.

1) The wafers were loaded into a sputtering system which was subsequently evacuated to a base pressure less than 5.0E-7 torr.

2) Native oxide was removed by an in situ DC sputter clean (200 volts, 30 mA) in an argon (Ar) atmosphere for (1.0-3.0) minutes prior to the Ti deposition.

3) Ti was sputter deposited in an Ar atmosphere to a target thickness of 20 nm-50 nm depending on the process technology.

4) The C49 phase of $TiSi_2$ was formed using a RTA in an $N_2$ atmosphere at 675° C. for 15 seconds.

5) Unreacted Ti and TiN were selectively removed with respect to the C49 $TiSi_2$ film using a 5:1 solution of $H_2SO_4$:$H_2O_2$.

6) The C49 phase of $TiSi_2$ was transformed to the low resistivity C54 phase of $TiSi_2$ by an 800° C. anneal in an $N_2$ atmosphere for 30 seconds.

7) The passivation oxide was deposited using chemical vapor deposition (CVD). The passivation oxide may contain dopants such as Boron (B), Phosphorus (O), and/or Arsenic (As).

8) The passivation oxide was densified using a 700° C. to 800° C. anneal in an inert atmosphere.

9) The passivation oxide was planarized by a mechanical/polishing process.

10) Contact windows were formed by standard photolithography and etching processes. The preferred etching process was a Reactive Ion Etch (RIE) process in a Hexode Reactor using the following process conditions:

$CHF_3$—10% $O_2$

Pressure—50 m torr

DC Bias Voltage—550 volts

The etch process had an etch rate ratio of passivation oxide to C54 $TiSi_2$ > 12:1.

11) The photoresist mask was removed using an $O_2$ plasma strip. The wafers were cleaned in a solution of 3:1 $H_2SO_4$:$H_2O_2$. Following this, the wafers were rinsed in deionized wafer and dried.

Figure 4:
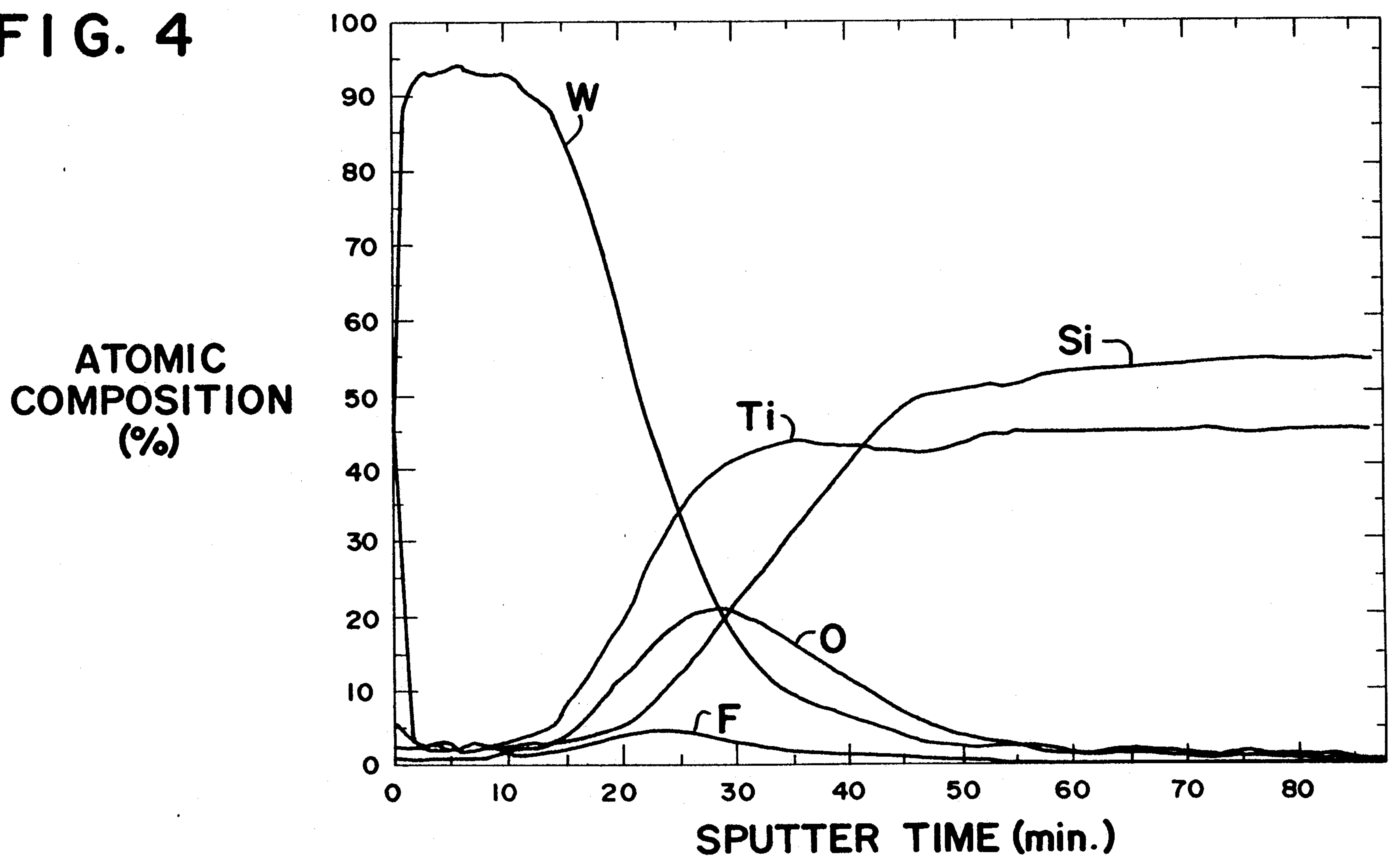
FIG. 4 is a graph of Augon Electron Spectroscopy (AES) depth profile of selective W deposition on C54 $TiSi_2$.

The result of selective W deposition on C54 $TiSi_2$ is shown in the AES spectrum presented in FIG. 4. Similar to all previous selective W deposition on C54 $TiSi_2$, a large O and F signal is present at the W-$TiSi_2$ interface.

EXAMPLE 3

Figure 6:
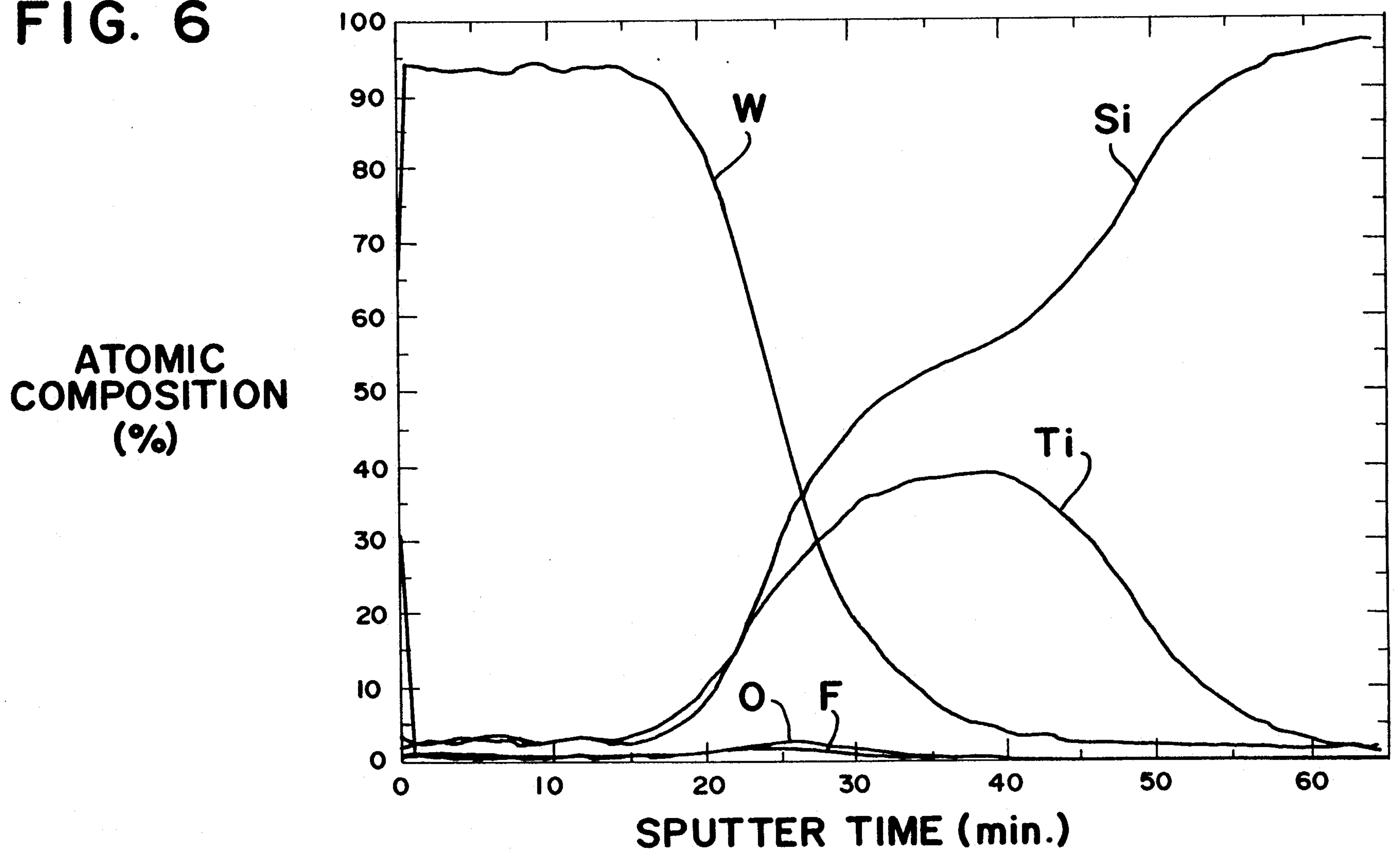
FIG. 6 is a plot of AES depth profile of selective W deposition on C54 $TiSi_2$ having a high Si concentration.

A group of C54 $TiSi_2$ samples in which were made a series of shallow Si implants at overlapping depths. Si was implanted at a dose of 1.0E16 $cm^{-2}$ at three different energies: 20, 24 and 28 KeV. These energies were selected to produce a constant Si concentration from the $TiSi_2$ surface to approximately 20 nm below the surface, after the pre-deposition dilute HF clean. Selective W deposition was then performed without the pre-deposition $H_2$ purge. The resulting AES depth profile is presented in FIG. 6. Clearly, the level of O contamination has been greatly reduced by the layered Si implants indicating that the excess Si present in the C49 $TiSi_2$ is involved in the reduction of the interfacial O concentration.

EXAMPLE 4-8

If one repeats the process according to Example 1, but deposits the metals (M): platinum, molybdenum, titanium, tantalum, or aluminum in place of the tungsten, an M-C49 $TiSi_2$ interface substantially free of oxygen and/or fluorine contamination will be obtained. When this product is further annealed, a M-C54 $TiSi_2$ product having desirable low resistivity will result.

EXAMPLE 9

If one repeats the process according to Example 1 using tungsten as the selective deposition metal but substitutes for the $TiSi_2$ layer, a silicon-rich silicide selected from the group; tungsten disilicide, molybdenum disilicide, tantalum disilicide, vanadium disilicide, chromium disilicide, and niobium disilicide, the resulting product will exhibit a W-silicide interface free of substantial oxygen and/or fluorine contamination and the resulting products will not require additional annealing unless the formation conditions produce a metastable silicide.

What is claimed is:

1. A process for the selective deposition of tungsten on a titanium disilicide surface which comprises:

1) first forming a metastable titanium disilicide layer on a substrate wherein said disilicide is characterized as a metastable C49 titanium disilicide ($TiSi_2$);

2) selectively depositing tungsten (W) on said C49 $TiSi_2$ to give a product having a W/C49 $TiSi_2$ interface which is substantially free of oxygen and/or fluorine contamination; and 3) annealing the product of step 2 at a temperature and time sufficient to convert the C49 $TiSi_2$ to C54 $TiSi_2$; wherein the C49 $TiSi_2$ layer of step 2 is characterized by a resistivity of from about 80 to about 120 μohm-cm and is converted by annealing to a C54 $TiSi_2$ characterized by a resistivity in the range of from about 5 μohm-cm to about 50 μohm-centimeter.

2. The process of claim 1 wherein the tungsten deposition on C49 $TiSi_2$ is carried out by chemical vapor deposition.

3. The process of claim 2 wherein the C49 $TiSi_2$ is formed by a rapid Thermal Anneal under protecting atmosphere using an anneal time of from about 10-35 seconds and anneal temperature of from about 575° C. to 700° C.

4. The process of claim 3 wherein the thermal anneal is conducted for 10-20 seconds at a temperature from about 575° C. to 675° C.

5. The process of claim 3 wherein the thermal anneal is conducted for 15-30 seconds at a temperature of about 700° C.

6. The process of claim 1 wherein the selective tungsten deposition is carried out by contacting the said C49 $TiSi_2$ layer with a mixture of $WF_6$ and hydrogen, a mixture of $WF_6$ with a silicon hydride or a mixture thereof.

7. The process of claim 5 wherein the selective tungsten deposition is carried out with a mixture of $WF_6$ and $SiH_4$.

8. The process of claim 5 wherein the selective tungsten deposition is carried out with a mixture of $WF_6$ and hydrogen.

9. A process to substantially reduce or eliminate interfacial oxygen and/or fluorine contamination in the selective deposition on $TiSi_2$ which comprises first selectively depositing tungsten on the surface of a metastable C49 $TiSi_2$ to give a product having a W-C49 $TiSi_2$ interface substantially free of oxygen and/or fluorine and then converting the C49 $TiSi_2$ in said product to C54 $TiSi_2$.

10. The process of claim 9 wherein the selective W deposition is carried out by contacting the C49 $TiSi_2$ with a mixture of $WF_6$ and hydrogen a reducing gas selected from the group consisting of hydrogen and silane.

11. The process of claim 10 wherein the C49 $TiSi_2$ on which the tungsten is selectively deposited is a silicon-rich $TiSi_2$ having a silicon content in excess of the stoichiometric formula amount.

12. The process of claim 11 wherein the silicon-rich $TiSi_2$ contains at least about 3.0 percent excess silicon over the stoichiometric amount.

13. A process for the selective deposition of a metal or metal compound on a (M) titanium disilicide encroachment barrier which comprises:

1) first forming a titanium disilicide layer on a substrate wherein said disilicide is characterized as a C49 titanium disilicide ($TiSi_2$);
2) selectively depositing said metal (M) on said C49 $TiSi_2$ to give a product having a M-C49 $TiSi_2$ interface which is substantially free of oxygen and/or fluorine contamination; and
3) annealing the product of step 2 at a temperature and time sufficient to convert the C49 $TiSi_2$ to C54 $TiSi_2$; wherein the C49 $TiSi_2$ layer of step 2 is characterized by a resistivity of from about 80 to about 120 $\mu$ohm-cm and is converted by annealing to a C54 $TiSi_2$ characterized by a resistivity in the range of from about 5 to about 50 $\mu$ohm-cm; wherein M is selected from the group consisting of: platinum, molybdenum, titanium, titanium nitride, tungsten, tantalum, copper, silver and aluminum.

14. The process of claim 13 wherein the metal deposition on C49 $TiSi_2$ is effected by chemical vapor deposition.

15. A process for the selective deposition of tungsten on a metal disilicide encroachment barrier which comprises:

1) first forming a metal disilicide $MSi_2$ layer on a substrate wherein said disilicide layer is characterized as having, at least on the surface thereof, an amount of silicon from about 2.5 to about 3.5 mole percent in excess of the calculated formula $MSi_2$; and
2) selectively depositing tungsten (W) on said $MSi_2$ layer to give a product having a W-$MSi_2$ interface which is substantially free of oxygen and/or fluorine contamination; and wherein said metal disilicide is selected from the group consisting of titanium disilicide, tungsten disilicide ($WSi_2$), molybdenum disilicide ($MoSi_2$), tantalum disilicide ($TaSi_2$), vanadium disilicide ($VSi_2$), platinum silicide (ptSi), nickel silicide (NiSi; $Ni_2Si$), chromium disilicide ($CrSi_2$) and niobium disilicide ($NbSi_2$).

16. The process of claim 15 wherein the metal disilicide is C54 $TiSi_2$.

* * * * *